United States Patent
Lesea (10) Patent No.: US 9,525,423 B1
(45) Date of Patent: Dec. 20, 2016

(54) POWER DISTRIBUTION NETWORK IP BLOCK

(71) Applicant: Xilinx, Inc., San Jose, CA (US)

(72) Inventor: Austin H. Lesea, Los Gatos, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/862,962

(22) Filed: Sep. 23, 2015

(51) Int. Cl.
  *H03K 19/177* (2006.01)
  *G06F 1/26* (2006.01)
  *G01R 31/317* (2006.01)
  *G01R 31/3185* (2006.01)

(52) U.S. Cl.
  CPC ... *H03K 19/17772* (2013.01); *G01R 31/31721* (2013.01); *G01R 31/318513* (2013.01); *G01R 31/318516* (2013.01); *H03K 19/17764* (2013.01); *H03K 19/17784* (2013.01)

(58) Field of Classification Search
  CPC .............. G01R 31/318513; G01R 31/318516; G01R 31/318519; G01R 31/318522; G01R 31/318525; G01R 31/318527; G01R 31/31853; G01R 31/318533; G01R 31/318536; G01R 31/318597; G01R 31/3187; G01R 31/31912; G01R 31/31915; G01R 31/17721; H03K 19/17764; H03K 19/17772; H03K 19/17784
  See application file for complete search history.

(56) References Cited

U.S. PATENT DOCUMENTS

| | | | | |
|---|---|---|---|---|
| 7,138,815 B1* | 11/2006 | Alexander | ......... | G01R 31/2853 324/750.3 |
| 7,368,940 B1* | 5/2008 | Schultz | ............ | H03K 19/17764 326/38 |
| 7,498,935 B2* | 3/2009 | Kodama | .................. | H04B 3/54 340/12.32 |
| 7,956,592 B2* | 6/2011 | Morroni | ................ | H02M 3/157 323/283 |
| 7,992,020 B1* | 8/2011 | Tuan | ..................... | G06F 1/3203 713/300 |
| 8,099,704 B1* | 1/2012 | Perisetty | ............... | G06F 17/505 326/37 |
| 8,513,974 B1* | 8/2013 | Van Dyken | ............... | G06F 7/38 326/15 |
| 8,624,971 B2* | 1/2014 | Brown | ............... | G01N 21/9501 348/126 |
| 8,639,952 B1* | 1/2014 | Chan | ........................ | G06F 1/26 713/300 |

\* cited by examiner

*Primary Examiner* — Vibol Tan
(74) *Attorney, Agent, or Firm* — Gerald Chen; Robert M. Brush (57) ABSTRACT

A device comprises a semiconductor substrate, a programmable logic device on the semiconductor substrate, a power distribution network comprising at least one voltage regulator on the semiconductor substrate, and a power management bus for communication between the at least one voltage regulator and the programmable logic device. The programmable logic device comprises a processing module configured to perform a diagnostic analysis of the power distribution network.

18 Claims, 5 Drawing Sheets

POWER DISTRIBUTION NETWORK IP BLOCK

TECHNICAL FIELD

An embodiment described herein relates generally to integrated circuit, and in particular, to voltage regulation for programmable logic devices.

BACKGROUND

Programmable logic devices exist as a well-known type of integrated circuit that may be programmed by a user to perform specified logic functions. One type of programmable logic devices is known as a field programmable gate array (FPGA). FPGAs operate by implementing algorithms directly in reconfigurable logic gates. The functionality and interconnection of the logic gates is defined by a control memory which can be reprogrammed as required. FPGAs are designed to be configured in the field by a customer after manufacturing in order to implement specific design functions.

Power supply in FPGAs are important because of the specific voltage and current requirements including complex initial conditions, transient behavior, turn-on/turn-off specifications and voltage sequencing. Thus, the power management for FPGAs is one of the most critical factors in a FPGA system design.

SUMMARY

A device comprises a semiconductor substrate; a programmable logic device on the semiconductor substrate; a power distribution network comprising at least one voltage regulator on the semiconductor substrate; and a power management bus for communication between the at least one voltage regulator and the programmable logic device, wherein the programmable logic device comprises a processing module configured to perform a diagnostic analysis of the power distribution network.

Optionally, the programmable logic device comprises a field programmable gate array (FPGA).

Optionally, the programmable logic device comprises a monitoring component configured to collect data from the power distribution network and transmit the collected data to the processing module for analysis.

Optionally, the monitoring component comprises an analog-to-digital (ND) converter.

Optionally, the processing module comprises a validation module configured to examine the programmable logic device for validation after the programmable logic device is programmed.

Optionally, the processing module is configured to monitor a behavior of the programmable logic device after the device is deployed for commercial use.

Optionally, the processing module comprises a frequency identifier configured to identify one or more frequencies where a power frequency resonance will occur.

Optionally, the processing module comprises a clock modification module configured to modify a clock feature to prevent a power frequency resonance from occurring.

Optionally, the processing module comprises a clock modification module configured to slow down a clock, speed up the clock, modulate the clock by a pseudo random sequence, disable the clock in a periodic manner, or any combination of the foregoing, to prevent a power frequency resonance from occurring.

Optionally, the programmable logic device is configured to control the power distribution network based on a result of the diagnostic analysis of the power distribution network.

Optionally, the device further includes a silicon substrate or a multi-chip module substrate.

A method comprises collecting data from a power distribution network that includes at least one voltage regulator on a semiconductor substrate, wherein the act of collecting the data is performed by a monitoring component in a programmable logic device; and analyzing the collected data to perform a diagnostic analysis of the power distribution network by a processing module in the programmable logic device.

Optionally, the programmable logic device comprises a field programmable gate array (FPGA).

Optionally, the monitoring component comprises an analog-to-digital (ND) converter, and the act of collecting the data from the power distribution network is performed by the ND converter.

Optionally, the act of analyzing the collected data for diagnosis of the power distribution network comprises examining the programmable logic device for validation after the programmable logic device is programmed.

Optionally, the method further comprises monitoring a behavior of the programmable logic device by the processing module after the device is deployed for commercial use.

Optionally, the act of analyzing the collected data for diagnosis of the power distribution network comprises identifying a frequency where a power frequency resonance will occur.

Optionally, the method further comprises modifying a clock feature by a clock modification module to prevent a power frequency resonance from occurring.

Optionally, the method further comprises slowing down a clock, speeding up the clock, modulating the clock by a pseudo random sequence, disabling the clock in a periodic manner, or any combination of the foregoing, by a clock modification module to prevent a power frequency resonance from occurring.

Optionally, the method further comprises controlling, by the programmable logic device, the power distribution network based on a result of the diagnostic analysis.

Other features, embodiments, and advantageous will be described in the detail description.

BRIEF DESCRIPTION OF THE DRAWINGS

The drawings illustrate the design and utility of some features, in which similar elements are referred to by common reference numerals. These drawings are not necessarily drawn to scale. In order to better appreciate how the above-recited and other advantages and objects are obtained, a more particular description will be rendered, which are illustrated in the accompanying drawings. These drawings are not to be considered limiting in the scope of the claims.

DETAILED DESCRIPTION

Various features are described hereinafter with reference to the figures. It should be noted that the figures are not drawn to scale and that the elements of similar structures or functions are represented by like reference numerals throughout the figures. It should be noted that the figures are only intended to facilitate the description. They are not intended as an exhaustive description of the claimed invention or as a limitation on the scope of the claimed invention. In addition, an illustrated item need not have all the aspects or advantages shown. An aspect or an advantage described in conjunction with a particular item is not necessarily limited to that item and can be practiced in any other items even if not so illustrated.

FPGA-based devices may make use of standalone voltage regulators for power requirements, wherein such voltage regulators are separate from the FPGA-based devices. Since the voltage regulators in the power distribution network are physically distanced from FPGAs, the voltage response time to the device demand is slower, and the power efficiency is affected. Furthermore, these FPGAs do not perform any direct monitoring, diagnosis or analysis of the power distribution network. Thus, when encountering issues, external testing equipment is required to analyze the power distribution network, or the device has to be sent to multiple companies (e.g., suppliers of the FPGAs, suppliers of the voltage regulators, etc.) for analysis. Thus, the troubleshooting process is time and resource consuming.

Embodiments of present disclosure provide a programmable logic device and voltage regulators integrated with the programmable logic device in the same integrated design and built into the same substrate. In some cases, the programmable logic device may be configured to monitor and analyze data from the power distribution network to confirm, check, and/or validate device performance. For example, the programmable logic device may perform a diagnostic analysis of the power distribution network. In some cases, the programmable logic device may perform a spectrum analysis on the voltage and current response without using an external testing equipment to check the power distribution network or sending the device to a third party company for analyzing the experienced power issues.

In some embodiments, the diagnostic analysis of the power distribution network may be performed by the programmable logic device to validate the device performance after the programmable logic device has been programmed but before the device incorporating such programmable logic device is deployed for regular use. In other embodiments, in addition or in the alternative to validating the device before deployment, the programmable logic device may also perform diagnostic analysis to check the performance of the deployed device after the device has been deployed.

In further embodiments, the programmable logic device may perform a diagnostic analysis of the power distribution network and control the power distribution network based on results of the diagnostic analysis. Because the voltage regulator is integrated with the programmable logic device in the same integrated design, and because the programmable logic device is configured to operate with the voltage regulator based on its analysis of the power distribution network, the voltage regulator response time may be reduced, and power supply efficiency may be improved. The programmable logic device may also provide a finer control on the voltage regulation down to single digit millivolts.

It should be note that the embodiments of present disclosure are not limited to single chip devices, and may be implemented in, e.g., multi-chip modules and other circuitry design.

Figure 1:
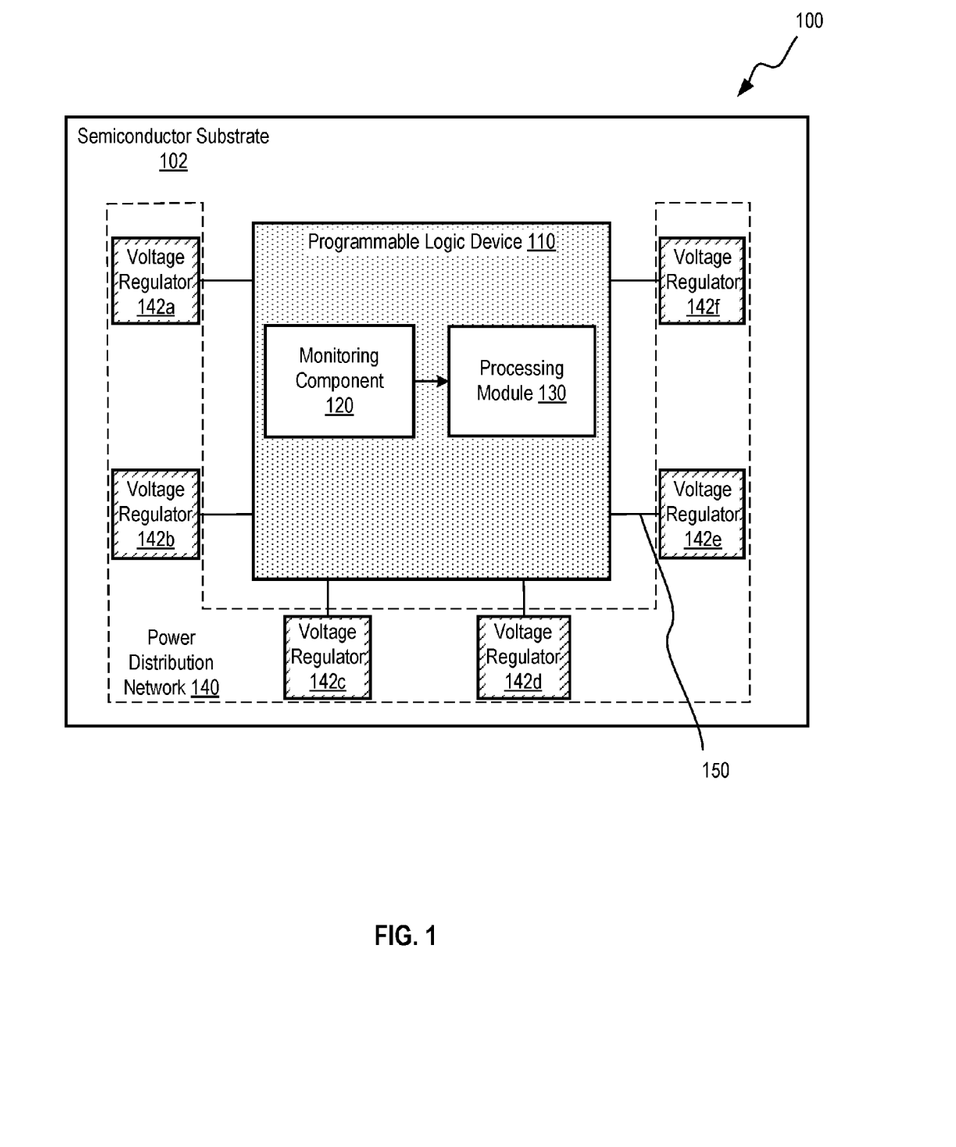
FIG. 1 is a block diagram illustrating a programmable logic device with integrated voltage regulators.

FIG. 1 illustrates a device 100 according to some embodiments. The device 100 includes a programmable logic device 110 on a semiconductor substrate 102. The device 100 also includes voltage regulators 142a-142f in a power distribution network 140, that are coupled (e.g., integrated) with the programmable logic device 110 in the device 100. The voltage regulators 142a-142f may be provided in a power region of the substrate 102. The device 100 also includes a power management (PM) bus 150 for communication between the programmable logic device 110 and the power distribution network 140. In other embodiments, besides the voltage regulators 142a-142f, the power distribution network 140 may include other components.

In some embodiments, the device 100 may include one or more substrates. For example, the device 100 may include a silicon substrate, or a multi-chip module (MOM) substrate. Thus, any of the components (e.g., voltage regulators 142, programmable logic device 110, etc.) of the device 100 may reside in a package that is implemented using MOM. Also, in some embodiments, the device 100 may include an organic substrate, such as a fiberglass-epoxy printed circuit board (PCB).

In the illustrated embodiments, the voltage regulators 142a-142f are configured for supplying power to the programmable logic device 110. In the illustrated example, the power distribution network 140 includes six voltage regulators 142a-142f. In other embodiments, the power distribution network may have more than six voltage regulators 142 or fewer than six voltage regulators 142. Depending on the requirements, one, a subset, or each, of the voltage regulators 142a-142f may be a linear or a switching regulator. These voltage regulators provide specified voltage levels over a wide range of load conditions in the programmable logic device 110. The supply voltage may be maintained within acceptable limits for reliable operation. If the supply voltage substantially changes or fluctuates out of the limits, the programmable logic device 110 will malfunction. According to some embodiments, the programmable logic device 110 may be configured to collect and analyze information of the power distribution network 140 including the supply voltage from the voltage regulators 142a-142f, and provide controls on the voltage regulators 142a-142f. The voltage regulators 142a-142f may communicate with the programmable logic device 110 via the PM bus 150.

The programmable logic device 110 is a type of integrated circuit that may be programmed to perform specified logic functions. In one embodiment, the programmable logic device 110 may comprise a field programmable gate array (FPGA). An exemplary FPGA will be discussed later in details in connection with FIG. 4.

Referring to FIG. 1, the programmable logic device 110 includes a monitoring component 120 and a processing module 130. The monitoring component 120 may be configured to monitor power performance of the power distribution network 140 and collect data. For example, the monitoring component 120 may monitor the voltage levels of the power distribution network 140 and record the voltage levels over time. In some cases, the voltage levels over time may be recorded in one or more non-transitory medium at the device 100 (e.g., in the programmable logic device 110 and/or outside the programmable logic device 110). In one implementation, the monitoring component 120 may include one or more analog-to-digital (ND) converters for collecting the data from the power distribution network. The monitoring component 120 may then transmit the collected data to the processing module 130 for analysis. By means of non-limiting examples, the data may be signal values from power rail(s) as they appear within the device, or may be values derived from signals from the power rail(s). Also, in some embodiments, the monitoring component 120 may collect data from a first power rail for core logic supply (e.g., Vccint), a second power rail for dual-port block SRAM supply (e.g., VccBRAM), or both.

The processing module 130 is configured to perform a diagnostic analysis of the power distribution network 140. In the illustrated embodiments, the processing module 130 includes digital signal processors (DSPs) to process the data collected by the monitoring component 120, a plurality of logics to perform the diagnostic analysis and/or make decisions, and block RAMs (BRAMs) to store results of the analysis.

The processing module 130 may be configured to analyze the data collected by the monitoring component 120, and examine the behavior of the programmable logic device 110 for specified functions and/or conditions at different stages, e.g., during programming of the programmable logic device 110, during a validation process that is after the programmable logic device 110 is programmed but before the device 10 is deployed, and/or during field operation of the device 10 that occurs after the device 10 is deployed for operation.

As discussed, the processing module 130 may be configured to perform analysis after the programmable logic device 110 is programmed, but before the device 100 is deployed for operation. In one embodiment, the processing module 130 may optionally include a validation module. The validation module may be configured to examine the programmable logic device 110 for validation after the programmable logic device 110 is programmed, but before it is deployed for operation (e.g., for field use). Thus, the processing module 130 may test the design on the programmable logic device 110, and modify it (or assist a user to modify it) using the analysis result to manage diagnostic issues before deploying the design for commercial use. Also, in some embodiments, the processing module 130 (e.g., the validation module) may be configured to determine minimum value(s), maximum value(s), or both, of voltage(s) being monitored in order to verify that the voltage(s) is within specification.

In addition, or alternatively, the processing module 130 may be configured to monitor the programmable logic device 110 after the device 100 is deployed for operation. For example, the processing module 130 may include a monitoring module to perform such function. Thus, a customer may use the analysis function provided by the processing module 130 to monitor and predict the behavior of the programmable logic device 110. In one embodiment, maintenance or services may be scheduled based on the real-time or historical analysis result provided from the processing module 130. Also, in some embodiments, the processing module 130 (e.g., the monitoring module) may be configured to determine if there is an oscillation occurring on one or more power rails by capturing blocks of data and performing a spectral analysis (e.g., FFT analysis) on the data.

In some embodiments, the processing module 130 may output a signal to inform status or conditions pertaining to the analysis result. In one embodiment, in a multi-chip module, the processing module 130 may pass the result of the diagnostic analysis to other units (e.g, an ARM processor), which in turn, may output the result through a communication network. Also, in some cases, the device 100 may include an output for outputting result of the diagnostic analysis for display on a screen, so that the diagnostic result can be presented to a user. The output of the device 100 may be implemented at the programmable logic device 110, or at another component in the device 100. In another embodiment, the processing module 130 may be configured to automatically trigger or take actions based on the diagnostic result in order to address the diagnostic issues. For example, the programmable logic device 110 may control and communicate with the voltage regulators 142a-142f based on the analysis result from the processing module 130. Thus, power issues may be automatically avoided during commercial use (e.g., after the device 100 is deployed) by using the processing module 130 to monitor the voltage data and implement various preventive actions.

One example of power issue that may be addressed using the processing module 130 is power frequency resonance. In some applications, power frequency resonance may occur when voltages exceed a range of the specification of the device 100. Power frequency resonance may cause power failure, thereby destroying the device 100 eventually if not addressed properly. In some embodiments, the processing module 130 may optionally include a frequency identifier to identify one or more frequencies of interest, e.g., one or more frequencies that are associated with power frequency resonance. The processing module 130 may analyze the collected data for largest voltages at various frequencies. For example, the processing module 130 may perform fast Fourier transform on the collected data to identify peaks in the voltage response. The processing module 130 may then identify, by the frequency identifier, one or more frequencies where the voltage is out of the specified range (i.e., where a power frequency resonance may occurs).

In some embodiments, the processing module 130 may take certain action(s) in response to the identified frequencies that are associated with an imminent power frequency resonance. For example, in some embodiments, the processing module 130 may generate and output an anti-resonance signal when a possible resonance is detected. The anti-resonance signal may be used to break up the frequencies to prevent power frequency resonance from occurring. In one implementation, the processing module 130 may optionally include a clock modification module configured to generate the anti-resonance signal. The anti-resonance signal may be used to modify a clock feature (e.g., a clock distribution, a clock parameter, etc.) in order to avoid the power frequency resonance. The clock feature may be modified by slowing down an internal clock, speeding up the clock, modulating by a pseudo random sequence, disabling the clock in a periodic manner, or any combination thereof.

In further embodiments, the processing module 130 may be configured to automatically modify a configuration of the programmable logic device 110 in such a way that would affect its interaction with the power distribution network 140 to thereby avoid the frequency resonance.

Figure 2:
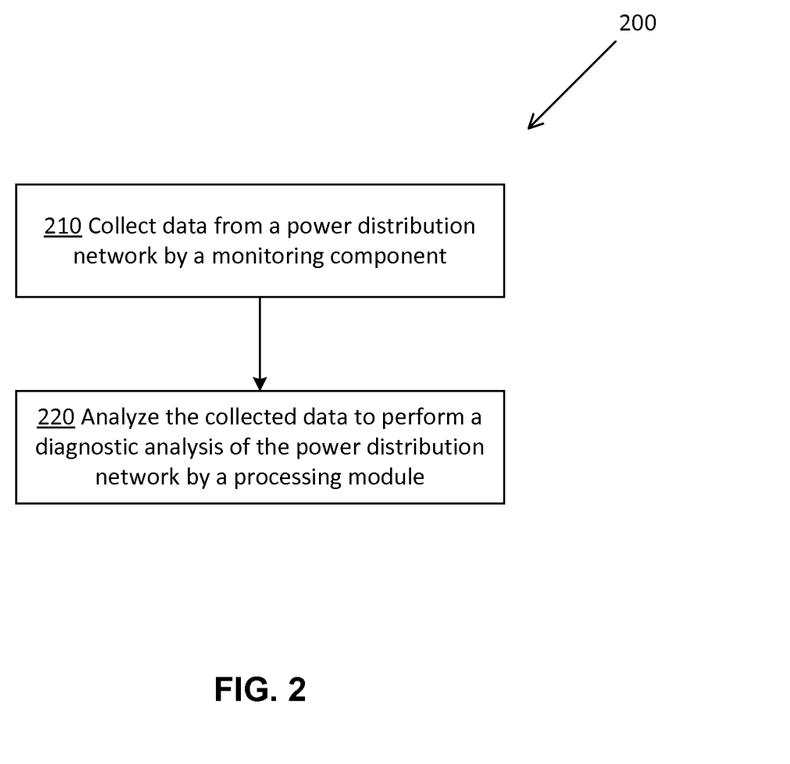
FIG. 2 is a flow chart illustrating a method for performing diagnosis analysis of a power distribution network.

FIG. 2 is a flow chart illustrating a method 200 for performing diagnostic analysis of a power distribution network using the programmable logic device 110 of FIG. 1. At item 210, a monitoring component in a programmable logic device performs the functions of monitoring and collecting data from a power distribution network. In some cases, the monitoring component may be the monitoring component 120 in the device 100, and the power distribution network may be the power distribution network 140 in the device 100. As discussed, the power distribution network 140 includes one or more voltage regulators 142 that are communicatively coupled with the programmable logic device 110. The monitoring component may comprise one or more ND converters for collecting the data from the power distribution network 140.

At item 220, the processing module 130 in the programmable logic device 110 analyzes the collected data to perform a diagnostic analysis of the power distribution network 140. Based on the analysis result, various actions may be implemented to improve the performance of the device 100, and/or to prevent undesirable issues from occurring. In some embodiments, the method 200 may optionally include controlling, by the programmable logic device 110, the power distribution network 140 based on a result of the diagnostic analysis.

In some embodiments, the act of analyzing the collected data for diagnosis of the power distribution network 140 in item 220 may include examining the programmable logic device 110 for validation after the programmable logic device 110 is programmed, but before the programmable logic device 110 is deployed for commercial use (e.g., field operation).

Also, in some embodiments, instead of, or in addition to, validating the programmable logic device 110, the act of analyzing the collected data for diagnosis of the power distribution network 140 in item 220 may include monitoring a behavior of the programmable logic device 110 by the processing module 130 after the device 100 is deployed for commercial use.

In addition, in some embodiments, the act of analyzing the collected data for diagnosis of the power distribution network 140 in item 220 may be performed to detect a condition that is associated with an imminent power frequency resonance. For example, the processing module 130 may identify a frequency where a power frequency resonance will occur.

Figure 3:
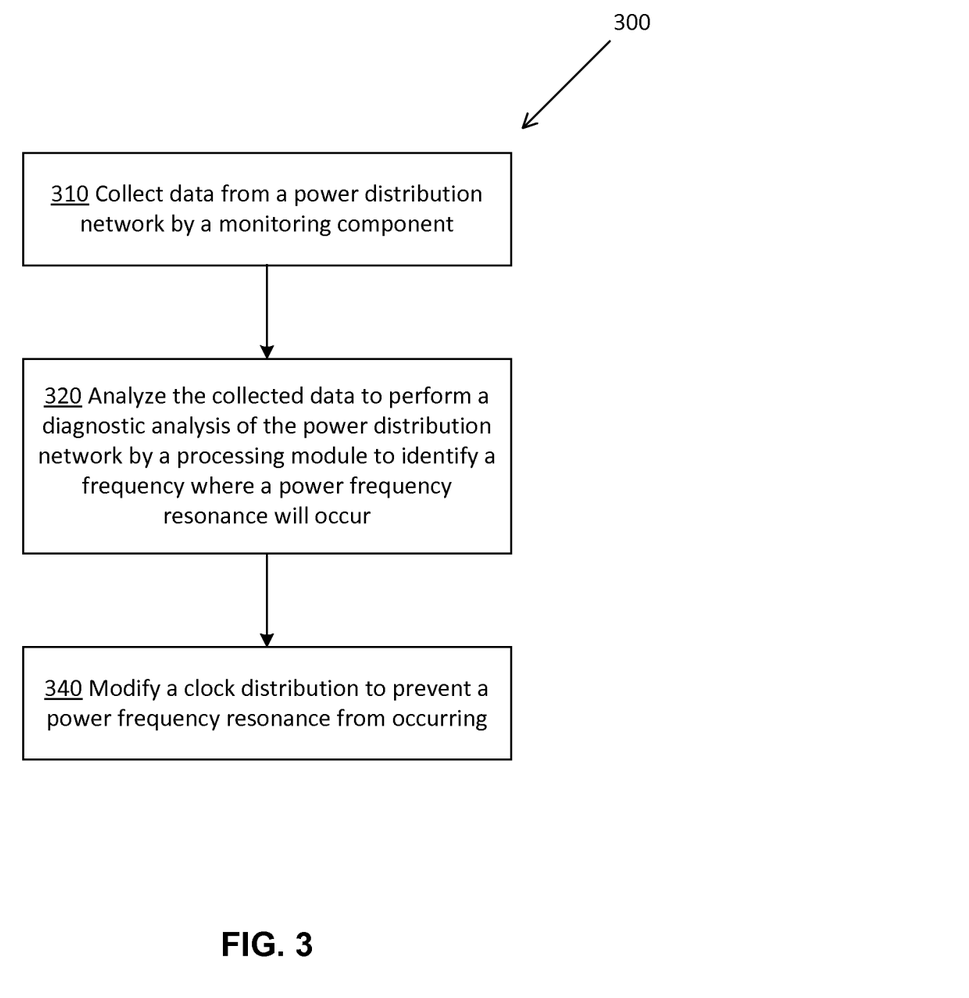
FIG. 3 is a flow chart illustrating a process for preventing a power frequency resonance from occurring.

FIG. 3 is a flow chart illustrating a method 300 for preventing a power frequency resonance from occurring using the programmable logic device 110 of FIG. 1. The method 300 may be an example of the method 200 that is implemented for addressing potential power frequency resonance. At item 310, data from the power distribution network 140 is collected by the monitoring component 120 in the programmable logic device 110. At item 320, the collected data is analyzed by the processing module 130 for a diagnosis of the power distribution network 140 to identify a frequency (e.g., by performing fast Fourier transform on the collected data to identify peaks in the voltage response) where a power frequency resonance will occur. Item 320 may be an example of the item 220 in the method 200. At item 340, the processing module 130 (e.g., a clock modification module in the processing module 130) may modify a clock feature to prevent a power frequency resonance from occurring. For examples, the processing module 130 may modify a clock feature by slowing down a clock, speeding up the clock, modulating the clock by a pseudo random sequence, disabling the clock in a periodic manner, or any combination of the foregoing. Accordingly, issues caused by power frequency resonance can be avoided.

Figure 4:
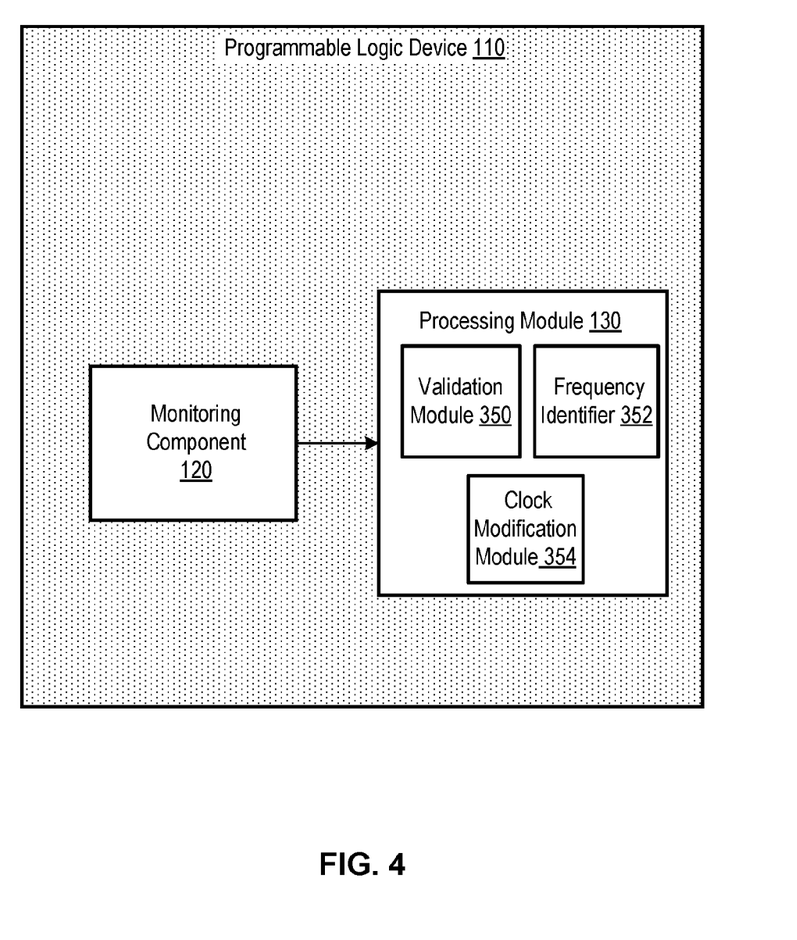
FIG. 4 illustrates an example of a programmable logic device.

As discussed, in some embodiments, the processing module 130 may include a validation module, a frequency identifier, and a clock modification module. FIG. 4 illustrates an example of the programmable logic device 110, particularly showing the programmable logic device 110 having a validation module 350, a frequency identifier 352, and a clock modification module 354.

Figure 5:
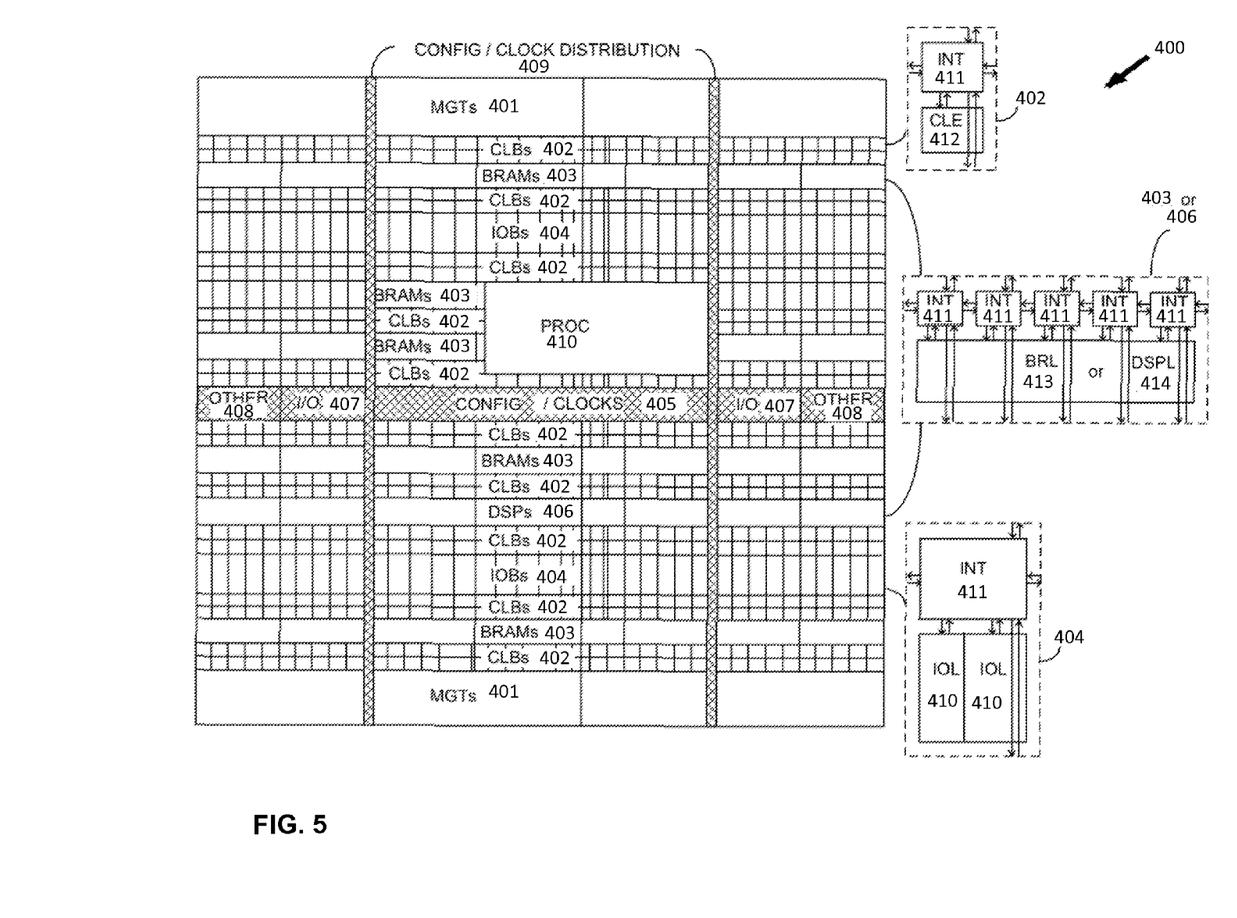
FIG. 5 illustrates an FPGA architecture with which one or more embodiments described herein may be implemented.

FIG. 5 illustrates a diagram of an exemplary FPGA architecture 400 that may integrate a power distribution network in a device as described above. The FPGA architecture 400 may be used to implement one or more features (e.g., the monitoring component 120, processing module 130, validation module 350, frequency identifier 352, and clock modification module 354, etc.) as described herein.

The FPGA architecture (400) that includes a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407), for example, clock ports, and other programmable logic 408 such as digital clock managers, analog-to-digital converters, system monitoring logic, and so forth. Some FPGAs also include dedicated processor blocks (PROC 410) and internal and external reconfiguration ports (not shown).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element INT 411 also includes the connections to and from the programmable logic element within the same tile.

For example, a CLB 402 can include a configurable logic element CLE 412 that can be programmed to implement user logic plus a single programmable interconnect element INT 411. A BRAM 403 can include a BRAM logic element (BRL 413) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 406 can include a DSP logic element (DSPL 414) in addition to an appropriate number of programmable interconnect elements. An IOB 404 can include, for example, two instances of an input/output logic element (IOL 415) in addition to one instance of the programmable interconnect element INT 411.

In the embodiment illustrated in FIG. 5, a columnar area near the center of the die (shown shaded in FIG. 5) is used for configuration, clock, and other control logic. Horizontal areas 409 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 410 shown in FIG. 5 spans several columns of CLBs and BRAMs.

PROC 410 can be implemented as a hard-wired processor that is fabricated as part of the die that implements the programmable circuitry of the IC. PROC 410 can represent any of a variety of different processor types and/or systems ranging in complexity from an individual processor, e.g., a single core capable of executing program code, to an entire processor system having one or more cores, modules, co-processors, interfaces, or the like.

In a more complex arrangement, for example, PROC 410 can include one or more cores, e.g., central processing units, cache memories, a memory controller, unidirectional and/or bidirectional interfaces configurable to couple directly to I/O pins of the programmable IC and/or couple to the programmable circuitry of the programmable IC. The phrase "programmable circuitry" can refer to the various programmable or configurable circuit blocks or tiles described herein, as well as the interconnect circuitry that selectively couples the various circuit blocks, tiles, and/or elements according to configuration data that is loaded into the IC. In an embodiment, the programmable circuitry also can be implemented as, or called, a programmable fabric. Using one or more interfaces that couple PROC 410 with the programmable circuitry, PROC 410 can perform power management functions for the entire IC. For example, PROC 410 can control power cycling of the programmable circuitry. In addition, PROC 410 can enter and exit a sleep or low power mode.

As discussed, the programmable logic device 110 may include one or a combination of the monitoring component 120, processing module 130, validation module, frequency identifier, and clock modification module, etc. In some embodiments, any of the above components may be implemented using the MGTs 401, CLBs 402, BRAMs 403, IOBs 404, CONFIG/CLOCKS 405, DSPs 406, I/O 407, programmable logic 408, PROC 410, INT 411, CLE 412, BRL 413, DSPL 414, IOL 415, or any combination of the foregoing, in the FPGA.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA, more than one adjacent column of CLBs is typically included wherever the CLBs appear, to facilitate the efficient implementation of user logic.

Also, it should be noted that the programmable logic device 110 is not limited to the exemplary FPGA described above, and that the programmable logic device 110 may be implemented using other types of programmable logic device, or other types of integrated circuits.

Although particular features have been shown and described, it will be understood that they are not intended to limit the claimed invention, and it will be made obvious to those skilled in the art that various changes and modifications may be made without departing from the spirit and scope of the claimed invention. The specification and drawings are, accordingly, to be regarded in an illustrative rather than restrictive sense. The claimed invention is intended to cover alternatives, modifications, and equivalents.

What is claimed is:

1. A device, comprising:
a semiconductor substrate;
a programmable logic device on the semiconductor substrate;
a power distribution network comprising at least one voltage regulator on the semiconductor substrate; and
a power management bus for communication between the at least one voltage regulator and the programmable logic device,
wherein the programmable logic device comprises a processing module configured to perform a diagnostic analysis of the power distribution network;
wherein the processing module comprises a frequency identifier configured to identify one or more frequencies where a power frequency resonance will occur.

2. The device of claim 1, wherein the programmable logic device comprises a field programmable gate array (FPGA).

3. The device of claim 1, wherein the programmable logic device comprises a monitoring component configured to collect data from the power distribution network and transmit the collected data to the processing module for analysis.

4. The device of claim 3, wherein the monitoring component comprises an analog-to-digital (ND) converter.

5. The device of claim 1, wherein the processing module comprises a validation module configured to examine the programmable logic device for validation after the programmable logic device is programmed.

6. The device of claim 1, wherein the processing module is configured to monitor a behavior of the programmable logic device after the device is deployed for commercial use.

7. A device, comprising:
a semiconductor substrate;
a programmable logic device on the semiconductor substrate;
a power distribution network comprising at least one voltage regulator on the semiconductor substrate; and
a power management bus for communication between the at least one voltage regulator and the programmable logic device,
wherein the programmable logic device comprises a processing module configured to perform a diagnostic analysis of the power distribution network;
wherein the processing module comprises a clock modification module configured to modify a clock feature to prevent a power frequency resonance from occurring.

8. The device of claim 7, wherein the the clock modification module is configured to slow down a clock, speed up the clock, modulate the clock by a pseudo random sequence, disable the clock in a periodic manner, or any combination of the foregoing, to prevent the power frequency resonance from occurring.

9. The device of claim 1, wherein the programmable logic device is configured to control the power distribution network based on a result of the diagnostic analysis of the power distribution network.

10. The device of claim 1, further comprising a silicon substrate or a multi-chip module substrate.

11. A method, comprising:
collecting data from a power distribution network that includes at least one voltage regulator on a semiconductor substrate, wherein the act of collecting the data is performed by a monitoring component in a programmable logic device; and
analyzing the collected data to perform a diagnostic analysis of the power distribution network by a processing module in the programmable logic device, the act of analyzing comprising identifying a frequency where a power frequency resonance will occur.

12. The method of claim 11, wherein the programmable logic device comprises a field programmable gate array (FPGA).

13. The method of claim 11, wherein the monitoring component comprises an analog-to-digital (NO) converter, and the act of collecting the data from the power distribution network is performed by the NO converter.

14. The method of claim 11, wherein the act of analyzing the collected data for diagnosis of the power distribution network comprises examining the programmable logic device for validation after the programmable logic device is programmed.

15. The method of claim 11, further comprising monitoring a behavior of the programmable logic device by the processing module after the device is deployed for commercial use.

16. The method of claim 11, further comprising modifying a clock feature by a clock modification module to prevent a power frequency resonance from occurring.

17. The method of claim 11, further comprising slowing down a clock, speeding up the clock, modulating the clock by a pseudo random sequence, disabling the clock in a periodic manner, or any combination of the foregoing, by a clock modification module to prevent a power frequency resonance from occurring.

18. The method of claim 11, further comprising controlling, by the programmable logic device, the power distribution network based on a result of the diagnostic analysis.

* * * * *